(12) United States Patent
Kameda et al.

(10) Patent No.: US 10,840,277 B2
(45) Date of Patent: Nov. 17, 2020

(54) SOLID STATE IMAGING DEVICE HAVING VARIATION IN OPTICAL BLACK PIXEL STRUCTURES RELATIVE TO IMAGE GENERATING PIXEL STRUCTURES TO PROVIDE SUBSTANTIALLY EQUIVALENT DARK CURRENT

(71) Applicant: Sony Corporation, Tokyo (JP)

(72) Inventors: Shinjiro Kameda, Kanagawa (JP); Eiichi Funatsu, Tokyo (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 152 days.

(21) Appl. No.: 13/956,054

(22) Filed: Jul. 31, 2013

(65) Prior Publication Data

US 2013/0313673 A1 Nov. 28, 2013

Related U.S. Application Data

(63) Continuation of application No. 11/825,579, filed on Jul. 6, 2007, now Pat. No. 8,519,502.

(30) Foreign Application Priority Data

Aug. 2, 2006 (JP) .................................. 2006-211244

(51) Int. Cl.
*H01L 27/146* (2006.01)

(52) U.S. Cl.
CPC .... *H01L 27/14601* (2013.01); *H01L 27/1463* (2013.01); *H01L 27/14603* (2013.01)

(58) Field of Classification Search
CPC .................. H01L 27/14603; H01L 27/1463
USPC .................................................. 257/443, 435
See application file for complete search history.

(56) References Cited

U.S. PATENT DOCUMENTS 6,724,022 B1 4/2004 Yoshida
2005/0253942 A1 11/2005 Muramatsu et al.

FOREIGN PATENT DOCUMENTS

| JP | 62-118574 | 6/1987 |
| JP | 10-107245 | 4/1998 |
| JP | 2003-134400 | 5/2003 |
| JP | 2005-176061 | 6/2005 |
| JP | 2005-223133 | 8/2005 |
| JP | 2006-147816 | 6/2006 |
| JP | 2006147816 A * | 6/2006 |

OTHER PUBLICATIONS

English translation of Mabuchi (JP 2006-147816).*

* cited by examiner

*Primary Examiner* — Marcos D. Pizarro
(74) *Attorney, Agent, or Firm* — Sheridan Ross P.C.

(57) ABSTRACT

A solid-state imaging device is provided. The solid-state imaging device includes an imaging region having a plurality of pixels arranged in a two-dimensional array, in which the imaging region includes an effective pixel and a black reference pixel; and a shape of a floating diffusion portion in the effective pixel is different from that of a floating diffusion portion in the black reference pixel.

6 Claims, 8 Drawing Sheets

SOLID STATE IMAGING DEVICE HAVING VARIATION IN OPTICAL BLACK PIXEL STRUCTURES RELATIVE TO IMAGE GENERATING PIXEL STRUCTURES TO PROVIDE SUBSTANTIALLY EQUIVALENT DARK CURRENT

CROSS REFERENCES TO RELATED APPLICATIONS

The subject matter of application Ser. No. 11/825,579, is incorporated herein by reference. The present application is a Continuation of U.S. Ser. No. 11/825,579, filed Jul. 6, 2007, which claims priority to Japanese Patent Application JP 2006-211244 filed in the Japanese Patent Office on Aug. 2, 2006, the entire contents of which being incorporated herein by reference.

BACKGROUND OF THE INVENTION

Field of the Invention

The present invention relates to a solid-state imaging device, and particularly to a solid-state imaging device which includes a photoelectric converting portion and a charge converting portion for converting charges generated at the photoelectric converting portion into a pixel signal, for example, a CMOS image sensor and the like.

Description of the Related Art

A CMOS image sensor is a solid-state imaging device including a plurality of pixels arranged in a two-dimensional array each having a photoelectric converting portion and a plurality of MOS transistors, so that a charge generated at the photoelectric converting portion is converted into a pixel signal and read. In recent years, such CMOS image sensor has attracted attention as an image capture element used for cameras for mobile phones, digital still cameras, digital video cameras and the like.

In image sensors, charges are generated by photo-electrically converting light at a photoelectric converting portion, for example, photodiode. In addition, electrons/holes may be generated due to a temperature change. These electrons/holes are termed dark current. Dark current is a main source of noise in such image sensor and it may influence image quality. Also, dark current may occur not only in a photodiode but also in a floating diffusion portion. Dark current in typical image sensors changes depending on a temperature and an accumulation time. Accordingly, when the dark current occurs, a signal output value in an optical black state, that is, in a state without exposure changes depending on a temperature and an accumulation time, so that a reference optical black level changes to affect contrast of images. As described above, dark current may be a main source of noise in such image sensors.

For example, in the case where a certain fixed signal level is used for a standard of A/D (analog-to-digital) conversion, dark current may cause a digital value of an optical black level to change depending on a temperature. Hence, a black level of a portion of an image obtained after image processing may be deteriorated to become gray or entirely black, causing an image to have unstable contrast.

Accordingly, most of image sensors include an effective pixel (hereinafter referred to as an "aperture pixel") in an effective pixel area and a black reference pixel (hereinafter referred to as an "OB (Optical Black) pixel") that outputs an optical black level, formed on one device. The OB pixel has the same structure as that of the aperture pixel. However light is shielded in the OB pixel with a light-shielding film formed on a wiring, and therefore, an optical black level can be output for each frame by reading a signal of the OB pixel. Thus, even in the case where a temperature change causes a change in dark current, a reference contrast level can be estimated using the aperture pixel based on the black level of the OB pixel.

Figure 1:
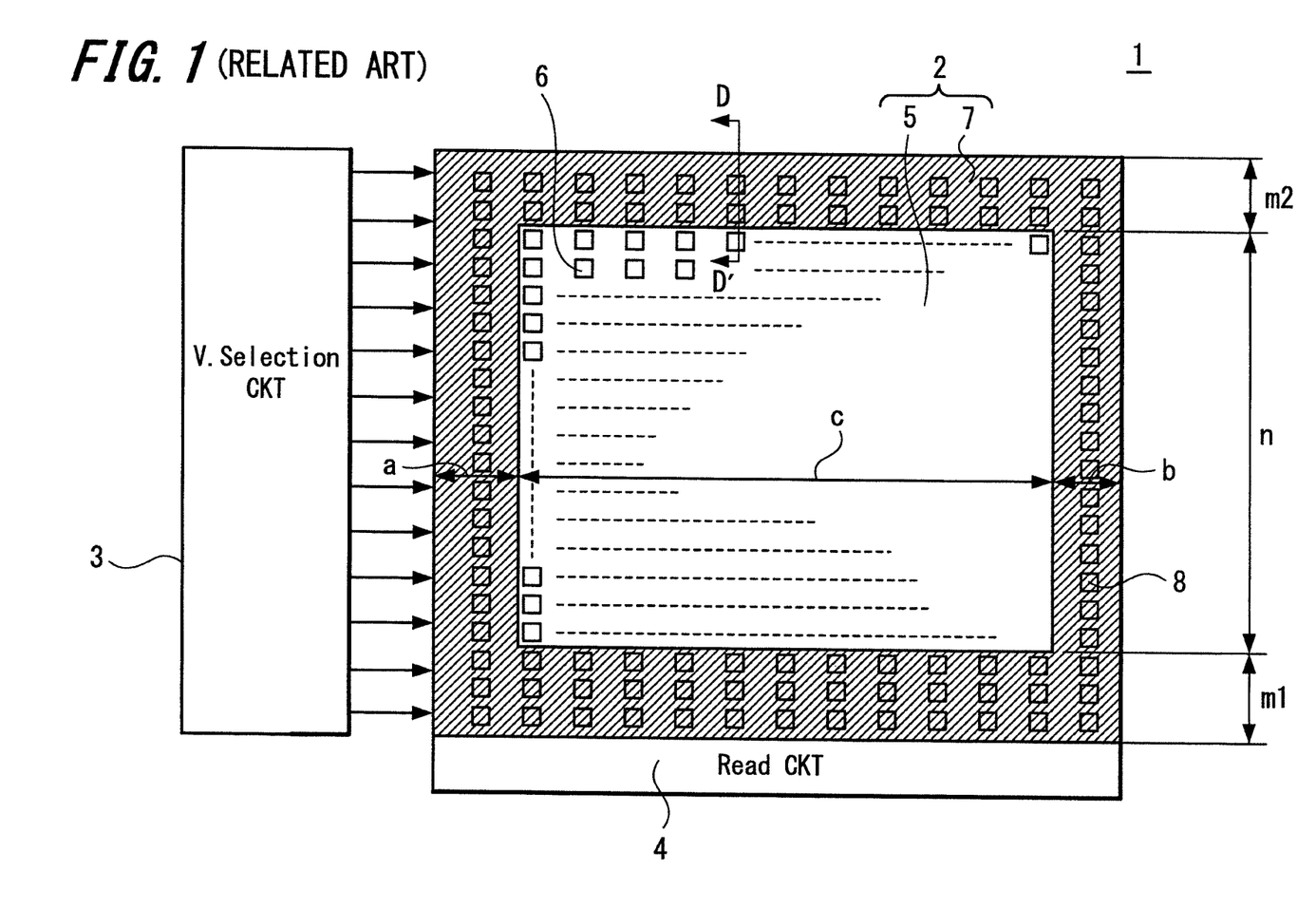
FIG. 1 is a schematic diagram showing a CMOS image sensor according to related art.

FIG. 1 shows a schematic diagram of a CMOS image sensor according to related art. As shown in FIG. 1, a solid-state imaging device 1 includes an imaging region 2, a vertical selection circuit portion 3 and a read circuit portion 4 disposed on the periphery of the imaging region 2. The imaging region 2 includes an effective pixel area 5 in which aperture pixels (effective pixels) 6 for capturing an object image are arranged and an optical black area 7 which is formed surrounding the effective pixel area 5 and in which light-shielded OB pixels 8 are arranged. Pixels including the aperture pixels 6 and the OB pixels 8 are regularly arranged in a two-dimensional array.

Each of the aperture pixels 6 and the OB pixels 8 includes, for example, a photodiode forming a photoelectric converting portion and a plurality of MOS transistors, for example, a transfer transistor, a reset transistor, an amplification transistor and a selection transistor.

The vertical selection circuit portion 3 includes a shift register, for example. The vertical selection circuit portion 3 selectively scans respective aperture pixels 6 and OB pixels 8 in the imaging region 2 sequentially one-line at a time in the vertical direction. Subsequently, the vertical selection circuit portion 3 supplies the read circuit portion 4 with signal charges generated at a photoelectric converting portion (photodiode) in each pixel in response to an amount of received light through a vertical signal line (not shown).

The read circuit portion 4 includes a horizontal signal line, a horizontal selection circuit, a column signal processing circuit, an output circuit and the like although not shown. Further, on the same chip, there is formed a control circuit. The control circuit generates a clock signal and a control signal to be referenced to operations of the vertical selection circuit portion 3, the read circuit portion 4 and the like based on a vertical synchronization signal, a horizontal synchronization signal and a master clock and inputs the clock signal and the control signal to the vertical selection circuit portion 3 and the read circuit portion 4.

Figure 2:
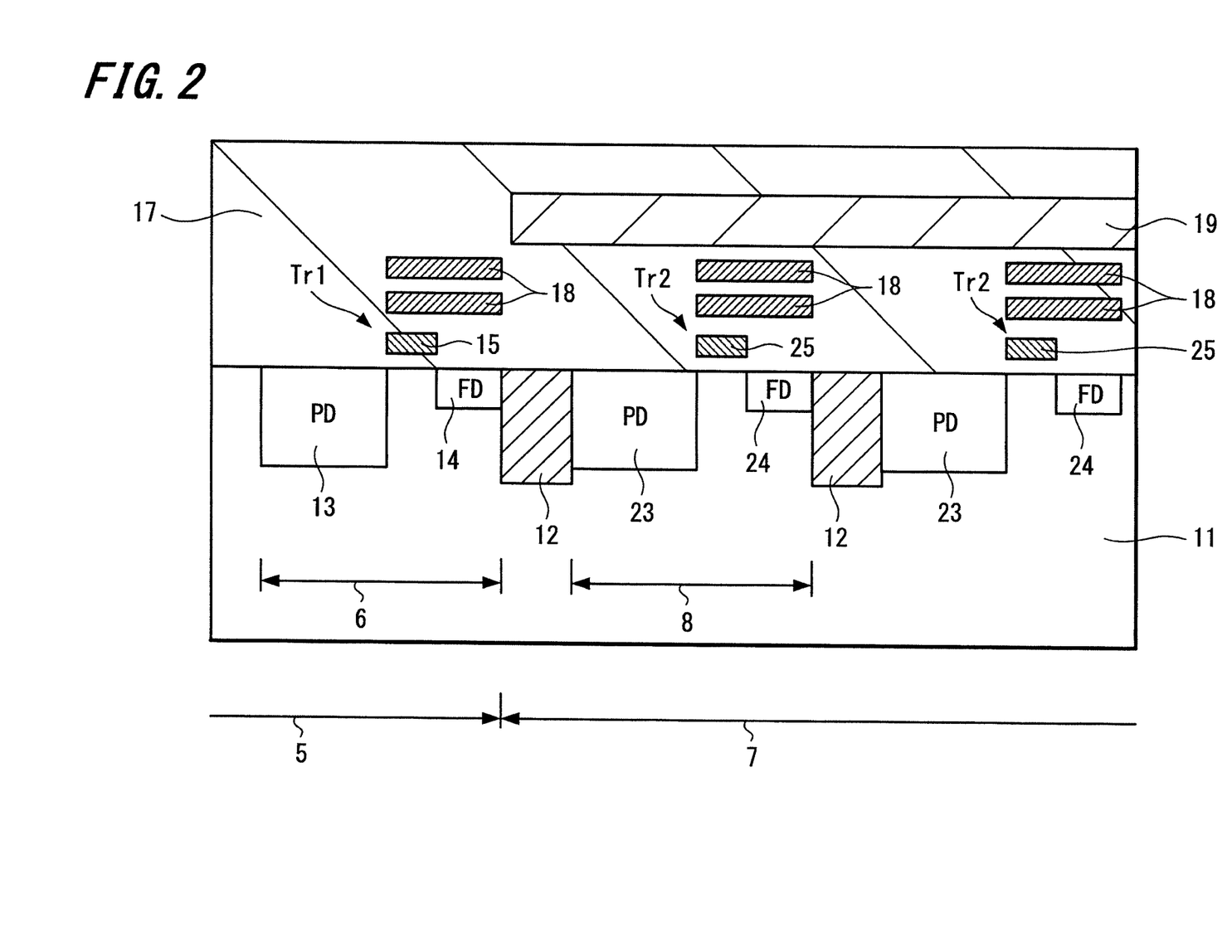
FIG. 2 is a cross-sectional view on the line D-D' in FIG. 1.

FIG. 2 shows a cross-sectional structure on the line D-D' that passes through the aperture pixel 6 and the OB pixel 8 in FIG. 1. As shown in FIG. 2, the aperture pixel 6 separated by an element isolating area 12 is formed on the effective pixel area 5 of a semiconductor substrate (for example, silicon substrate) 11 and the OB pixel 8 similarly separated by the element isolating area 12 is formed on the optical black area 7. The aperture pixel 6 includes a photodiode (PD) 13 as a photoelectric converting portion and a plurality of MOS transistors (a transfer transistor Tr1 alone is shown in FIG. 2). The transfer transistor Tr1 includes a semiconductor area as a floating diffusion (FD) portion 14, and a transfer gate electrode 15 formed through the photodiode 13 and a gate insulated film. The OB pixel 8 includes a photodiode (PD) 23 as a photoelectric converting portion and a plurality of MOS transistors (a transfer transistor Tr2 alone is shown in FIG. 2). The transfer transistor Tr2 includes a semiconductor area as a floating diffusion (FD) portion 24 and a transfer gate electrode 25 formed through the photodiode 23 and the gate insulated film.

A multilayer wiring 18 is formed above the semiconductor substrate 11 through an insulating interlayer 17. Further, in the optical black area 7, a light-shielding film 19 made of metal, for example, Al (aluminum) is formed above the multilayer wiring 18. It should be noted that a color filter, an on-chip lens and the like are formed on the light-shielding film 19 through a planarized film although not shown.

Figure 3A:
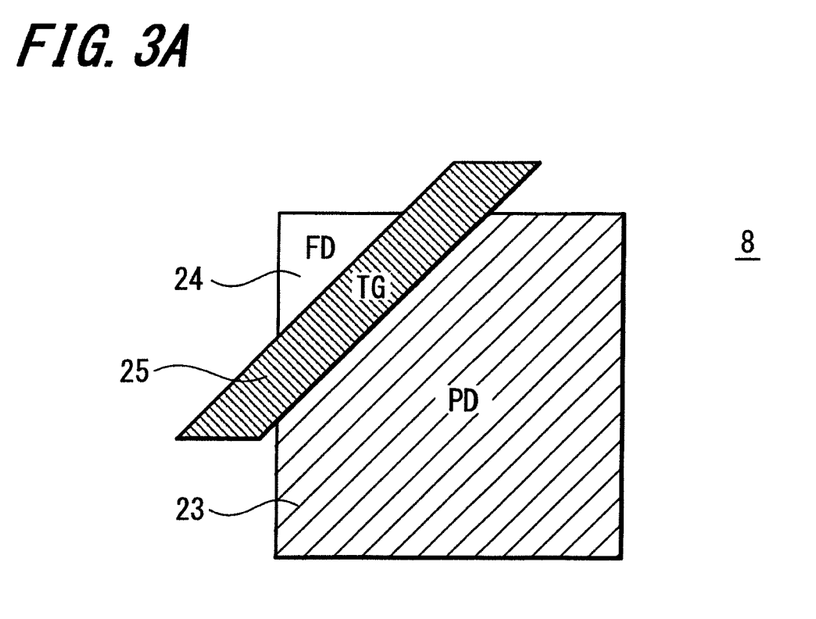
FIG. 3A is a schematic diagram showing a layout of an OB (optical black) pixel according to the related art.
Figure 3B:
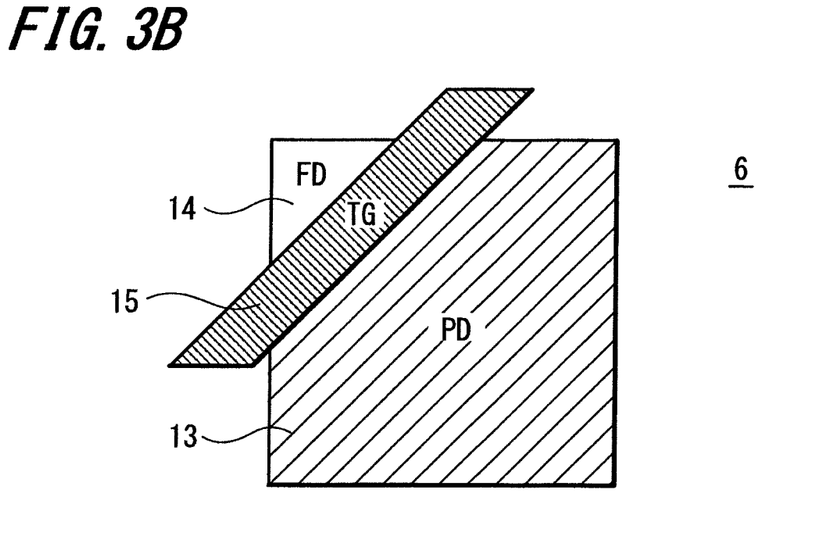
FIG. 3B is a schematic diagram showing a layout of an aperture pixel according to the related art.

FIG. 3A shows a schematic planar structure of the photodiode (PD) 23 and the floating diffusion (FD) portion 24 of the OB pixel 8, and FIG. 3B shows a schematic planar structure of the photodiode (PD) 13 and the floating diffusion (FD) portion 14 of the aperture pixel 6, respectively. The size of the photodiode 23 in the OB pixel 8 is equal to that of the photodiode 13 in the aperture pixel 6, and the size of the floating diffusion portion 24 in the OB pixel 8 is equal to that of the floating diffusion portion 14 in the aperture pixel 6.

Figure 4:
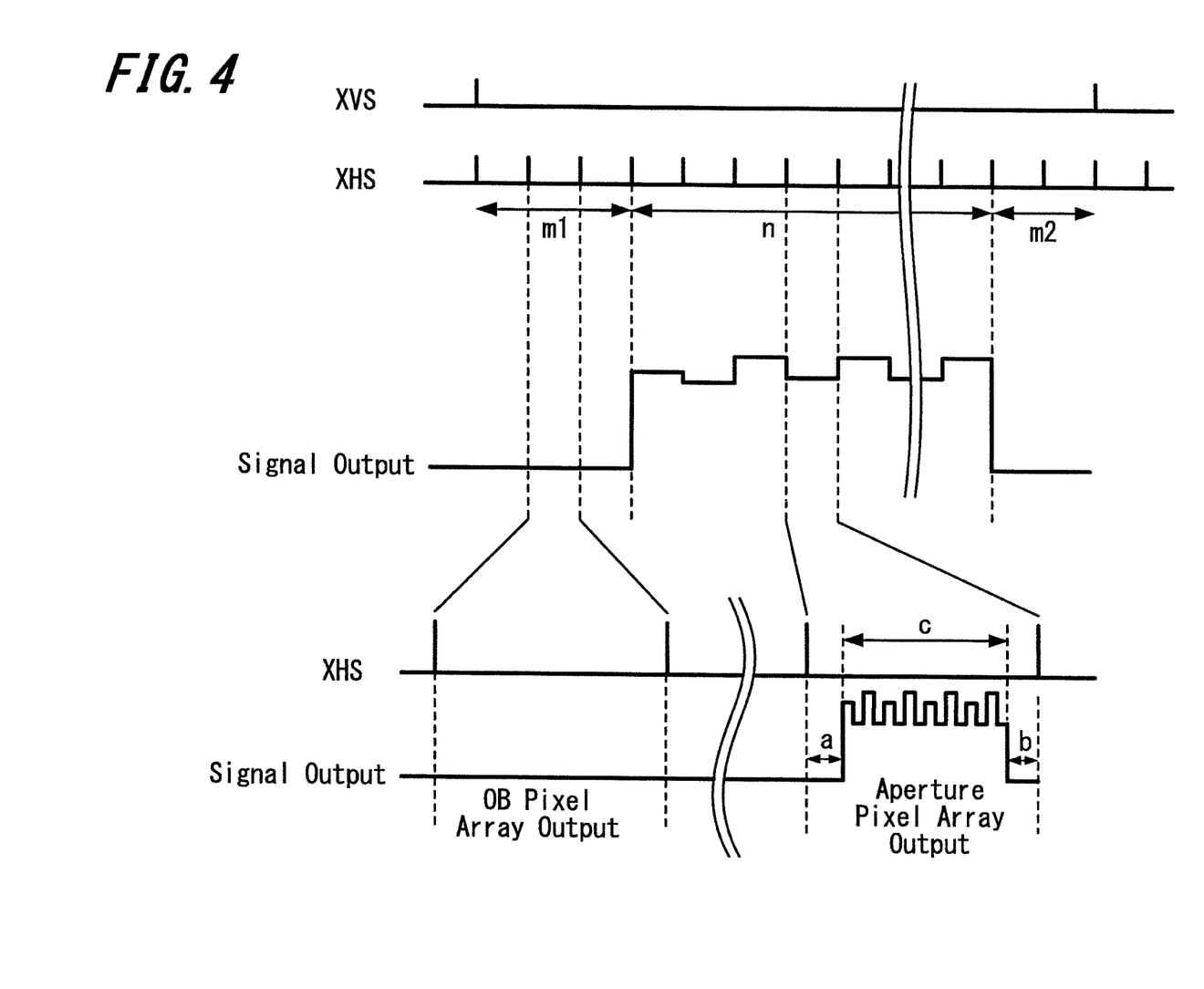
FIG. 4 is a schematic diagram showing a scanning operation of reading a signal in a CMOS image sensor according to the related art.

Using the above-mentioned arrangement, an image is read. Scanning operations to read image signals will be described below in detail. First, the OB pixels 8 and the aperture pixels are sequentially selected and read in accordance with the horizontal synchronization signal through the vertical selection circuit 3. FIG. 4 shows an example of a signal output that is read. In this example, OB pixel lines on one side are made m1 including three lines (m1=3) and OB pixel lines on the other side are made m2 including two lines (m2=2) as shown in FIG. 1. Signal outputs of an OB pixel line and an aperture pixel line in one horizontal scanning period during a horizontal synchronization signal (XHS) are shown in an enlarged-scale.

With a vertical synchronization signal (XVS) triggered, an image of one frame is output during a period until the next vertical synchronization signal. A signal for one line is output with the horizontal synchronization signal (XHS) triggered in the period of the vertical synchronization signal. Regarding a signal output of one line, an OB pixel line outputs an optical black (OB) output level alone, but an aperture pixel line outputs optical black (OB) output levels a and b with a signal output c.

Typically, an output value of the OB pixel 8 read at the beginning of one frame is sampled and the output value of the OB pixel 8 is applied to the black level of the aperture pixel 6 within the frame based on the sampled result. Therefore, even in the case where a temperature changes suddenly, an amount of dark current due to the change of a temperature within one frame can be canceled.

According to the above-mentioned arrangement, even in the case where dark current that changes depending on a temperature and an accumulation time is generated in the aperture pixel 6, contrast of an image may be prevented from deteriorating with dark current. Specifically, since an amount of dark current is also measured in the OB pixel 8 under the same condition, contrast of an image on the aperture pixel 6 is determined by using the black level of the OB pixel 8 as a reference level.

However, in the case where the light-shielding film 19 is formed above the OB pixel 8, it may be difficult for an amount of dark current of the OB pixel 8 to be equal to that of the aperture pixel 6 due to the difference in a surface level between those pixels. The reason that the optical black level of the OB pixel 8 is used as a reference is based on an assumption that the amount of dark current of the OB pixel 8 and that of the aperture pixel 6 are equal. Therefore, in the case where the amount of dark current of the OB pixel 6 and that of the aperture pixel 8 are different from each other, the amount of dark current of the OB pixel 6 as the reference for the optical black level may not be applied to the aperture pixel 8. As a result, even in the case where a temperature may not change within one frame, image contrast on the aperture pixel 8 will be affected. A small difference between the amount of dark current of the OB pixel 8 and that of the aperture pixel 6 may greatly affect the image contrast in the case where a user intends to extend an accumulation time in order to capture an image of a dark object.

Japanese Unexamined Patent Application Publication No. H10-107245 (JP No. H10-107245 A) discloses a method of removing a photodiode from an OB pixel in order to control dark current in the OB pixel.

SUMMARY OF THE INVENTION

In a pixel including a photodiode and a floating diffusion portion, dark current may be generated at the photodiode and the floating diffusion portion. In the case where dark current is read as a signal, the sum of an amount of dark current caused in the photodiode and that caused in the floating diffusion portion is read. If the shape of the aperture pixel and that of the OB pixel are identical to each other as shown in the related art technology in FIG. 2 and FIGS. 3A and 3B, it may be difficult to make an amount of dark current of the aperture pixel and that of the OB pixel uniform. Specifically, the Al (aluminum) light-shielding film 19 formed above the OB pixel may affect the amount of dark current of the OB pixel. In other words, if the size of the floating diffusion portions and the size of the photodiodes are respectively equal between the OB pixel and the aperture pixel, there may still be a difference in the amount of dark current.

Difference between an amount of dark current of the aperture pixel and that of the OB pixel may be caused by respective reasons resulted from the photodiode and the floating diffusion portion. However, since the process for manufacturing the photodiode and that for manufacturing the floating diffusion portion are not the same, difference in the amount of dark current varies. Typically, the area of the photodiode is larger than that of the floating diffusion portion, and therefore, difference in dark current caused at the photodiode may be large in most cases.

JP No. H10-107245 A proposes a method of controlling dark current by removing the photodiode from the OB pixel as described above. However, according to the method, the amount of dark current of an OB pixel is extremely reduced compared with an aperture pixel, and therefore, the black level may be different between those pixels depending on a temperature and an accumulation time.

In view of the above, it is desirable to provide a solid-state imaging device capable of outputting an optical black level that is prevented from being fluctuated depending on a temperature and an accumulation time and of reducing an influence on contrast of an image by adjusting a difference in the amount of dark current generated at an aperture pixel and generated at an OB pixel.

According to an embodiment of the present invention, there is provided a solid-state imaging device having an imaging region including a plurality of pixels arranged in a two-dimensional array. The imaging region includes an effective pixel and a black reference pixel, and the shape of a floating diffusion portion in the effective pixel is different from that in the black reference pixel.

According to an embodiment of the solid-state imaging device of the present invention, the shape of the floating diffusion portion in the black reference pixel is different from that in the effective pixel. Accordingly, the sum of dark current in the black reference pixel is made equal to that in the aperture pixel.

According to an embodiment of the solid-state imaging device of the present invention, since an amount of dark current in the black reference pixel and that in the effective pixel can be made equal without deteriorating characteristics of the solid-state imaging device, a stable black level can be output, thereby improving image contrast.

DESCRIPTION OF THE PREFERRED EMBODIMENTS

Embodiments of the present invention will be described below with reference to the drawings.

A solid-state imaging device according to the embodiments of the present invention is a CMOS image sensor having as a unit a pixel including a photoelectric converting portion and a charge converting portion for converting charges generated at the photoelectric converting portion into a pixel signal.

Figure 5:
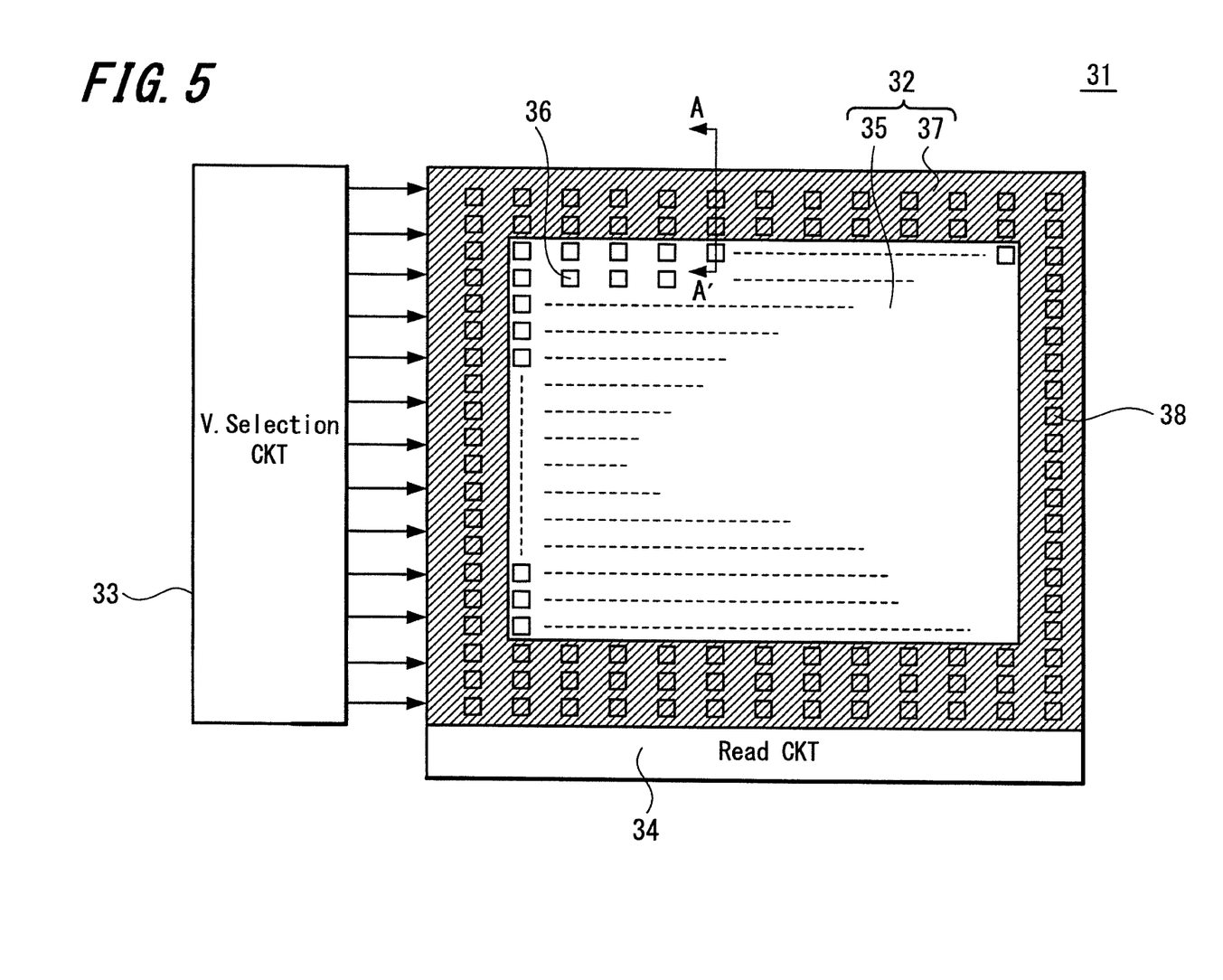
FIG. 5 is a schematic diagram showing a CMOS image sensor according to an embodiment of the present invention.

FIG. 5 shows a schematic diagram of a CMOS image sensor according to the embodiment of the present invention. As shown in FIG. 5, a solid-state imaging device 31 according to the embodiments of the present invention includes an imaging region 32; and a vertical selection circuit portion 33 and a read circuit portion 34 located on the periphery of the imaging region 32. The imaging region 32 includes an effective pixel area 35 having effective pixels (hereinafter referred to as "aperture pixels") 36 for capturing an object image, and an optical black area 37 surrounding the effective pixel area 38 and having light-shielded black reference pixels (hereinafter referred to as "OB pixels") 38. The aperture pixels 36 and the OB pixels 38 are arranged in a two-dimensional array.

Each of the aperture pixels 36 and the OB pixels 38 includes a photodiode, for example, forming a photoelectric converting portion and a plurality of MOS transistors, for example, a transfer transistor, a reset transistor, an amplification transistor and a selection transistor.

The vertical selection circuit portion 33 includes a shift register, for example. The vertical selection circuit portion 33 selectively scans respective aperture pixels 36 and OB pixels 38 in the imaging region 32 sequentially one-line at a time in the vertical direction. Subsequently, the vertical selection circuit portion 33 supplies the read circuit portion 34 with signal charges generated at a photoelectric converting portion (photodiode) in each pixel in response to an amount of received light through a vertical signal line (not shown).

The read circuit portion 34 includes a horizontal signal line, a horizontal selection circuit, a column signal processing circuit, an output circuit and the like although not shown. Further, on the same chip, there is formed a control circuit. The control circuit generates a clock signal and a control signal to be referenced to operations of the vertical selection circuit portion 33, the read circuit portion 34 and the like based on a vertical synchronization signal, a horizontal synchronization signal and a master clock and inputs the clock signal and the control signal to the vertical selection circuit portion 33 and the read circuit portion 34.

Figure 6:
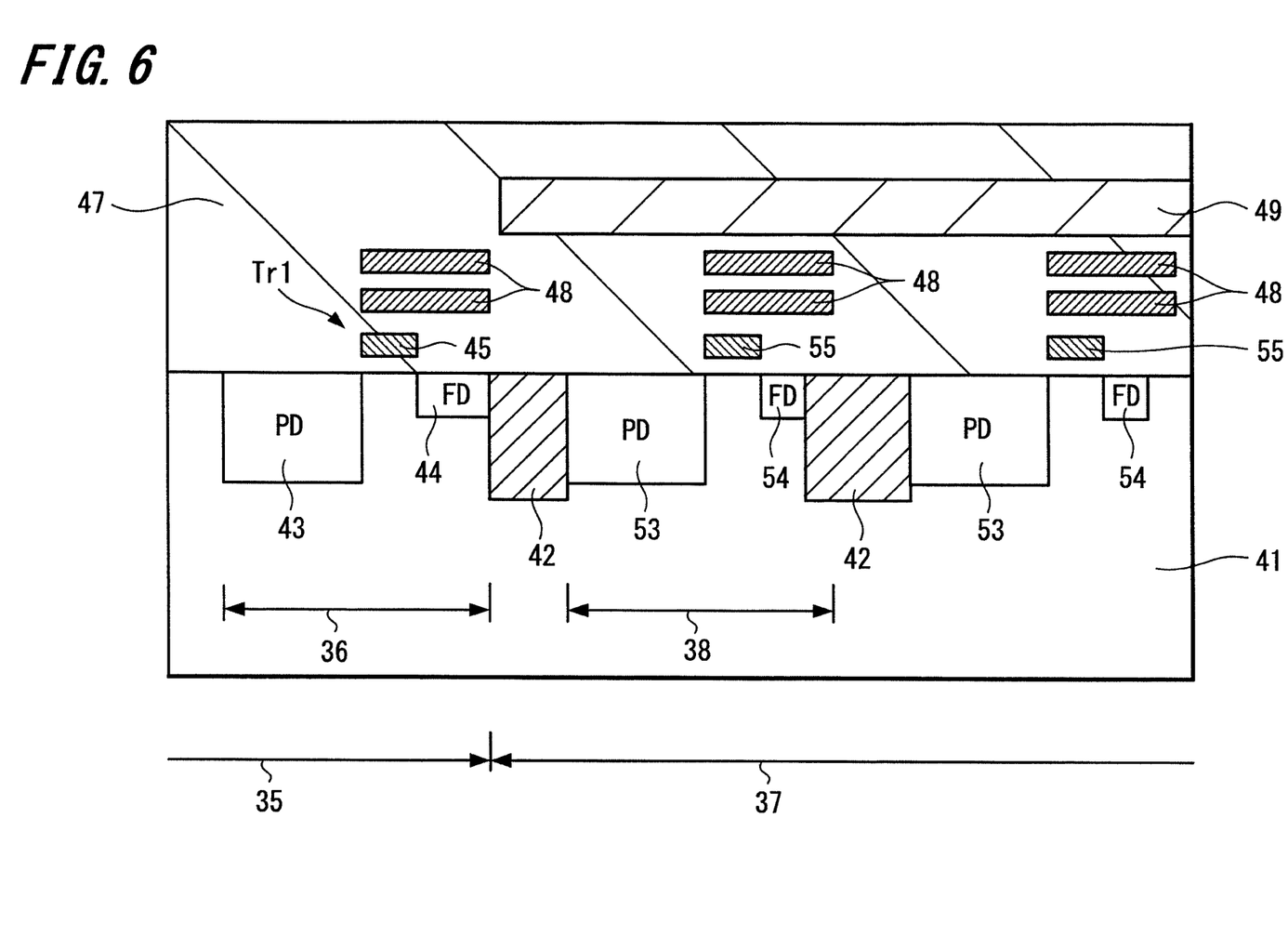
FIG. 6 is a cross-sectional view on the line A-A' in FIG. 5.

FIG. 6 shows a cross-sectional structure on the line A-A' that passes through the aperture pixel 36 and the OB pixel 38 in FIG. 5. As shown in FIG. 6, the aperture pixel 36 separated by an element isolating area 42 is formed on the effective pixel area 35 of a semiconductor substrate (for example, silicon substrate) 41 and the OB pixel 38 similarly separated by the element isolating area 42 is formed on the optical black area 37. The aperture pixel 36 includes a photodiode (PD) 43 as a photoelectric converting portion and a plurality of MOS transistors (a transfer transistor Tr1 alone is shown in FIG. 6). The transfer transistor Tr1 includes a semiconductor area as a floating diffusion (FD) portion 44, and a transfer gate electrode 45 formed through the photodiode 43 and a gate insulated film. The OB pixel 38 includes a photodiode (PD) 53 as a photoelectric converting portion and a plurality of MOS transistors (a transfer transistor Tr2 alone is shown in FIG. 6). The transfer transistor Tr2 includes a semiconductor area as a floating diffusion (FD) portion 54 and a transfer gate electrode 55 formed through the photodiode 53 and the gate insulated film.

A multilayer wiring 48 is formed above the semiconductor substrate 41 through an insulating interlayer 47. Further, in the optical black area 37, a light-shielding film 49 made of metal, for example, Al (aluminum) is formed above the multilayer wiring 48. It should be noted that a color filter, an on-chip lens and the like are formed on the light-shielding film 49 through a planarized film although not shown.

Here, according to the embodiment of the present invention, as described later in detail, in order to make the amount of dark current of the aperture pixel 36 equal to that of the OB pixel 38, the shape of the floating diffusion (FD) portion 44 in the aperture pixel 36 is made different from that of the floating diffusion (FD) portion 54 in the OB pixel 38.

A signal can be read from the solid-state imaging device according to the embodiment of the present invention similarly to the aforementioned related-art example and therefore may not be described here.

The following Table 1 shows dark current components of the photodiodes 43, 53 in the aperture pixel 36 and the OB pixel 38 respectively, and dark current components of the floating diffusion portions 44, 54 in the aperture pixel 36 and the OB pixel 38, respectively. In Table 1, P1 indicates a dark current component generated at the photodiode 53 in the OB pixel 38 and F1 indicates a dark current component generated at the floating diffusion portion 54 in the OB pixel 38. Also, P2 indicates a dark current component generated at the photodiode 43 in the aperture pixel 36 and F2 indicates a dark current component generated at the floating diffusion portion 44 in the aperture pixel 36.

TABLE 1

Example of Generated Amount of Dark Current

| | OB Pixel | Aperture Pixel |
|---|---|---|
| Photodiode | P1 | P2 |
| Floating Diffusion Portion | F1 | F2 |

In the case of reading dark current as a signal, the sum of a dark current component generated at the photodiode 43 and that generated at the floating diffusion portion 44 is read. Also, the sum of a dark current component generated at the photodiode 53 and that generated at floating diffusion 54 is read. Therefore, according to Table 1, an equation of F1+P1=F2+P2 represents that the amount of dark current of the aperture pixel and that of the OB pixel are equal to each other.

Next, embodiments of the present invention will be described in detail in addition to an adjusting method to obtain the relationship represented by the equation of F1+P1=F2+P2 regarding the amount of dark current. According to the embodiments of the present invention, in order to make the dark current of the aperture pixel 36 and that of the OB pixel 38 equal to each other without deteriorating performance of the device, the aperture pixel 36 is designed to have optimum imaging characteristics and the OB pixel 38 is controlled to adjust dark current. In order to obtain the relationship represented by the equation of F1+P1=F2+P2, F1 alone is adjusted. Dark current components increase as the surface areas or circumferential lengths of the photodiode and the floating diffusion portion increase. In addition, dark current of the OB pixel 38 is typically larger than that of the aperture pixel 36.

Therefore, according to the embodiments of the present invention, the equation of F1+P1=F2+P2 may be satisfied by making the dark current component F1 smaller than the dark current component F2.

According to a first embodiment of the present invention, as shown in FIG. 6, the surface area of the floating diffusion portion 44 in the aperture pixel 36 is different from that of the floating diffusion portion 54 in the 08 pixel 38. In this embodiment, the surface area of the floating diffusion portion 54 in the OB pixel 38 is made smaller than that of the floating diffusion portion 44 in the aperture pixel 36.

According to the first embodiment of the present invention, the shape or the surface area of the floating diffusion portion in the OB pixel 38 is smaller than that of the floating diffusion portion 44 in the aperture pixel 36, thereby adjusting the amount of dark current to obtain the relationship represented by the equation of F1+P1=F2+P2.

Figure 7A:
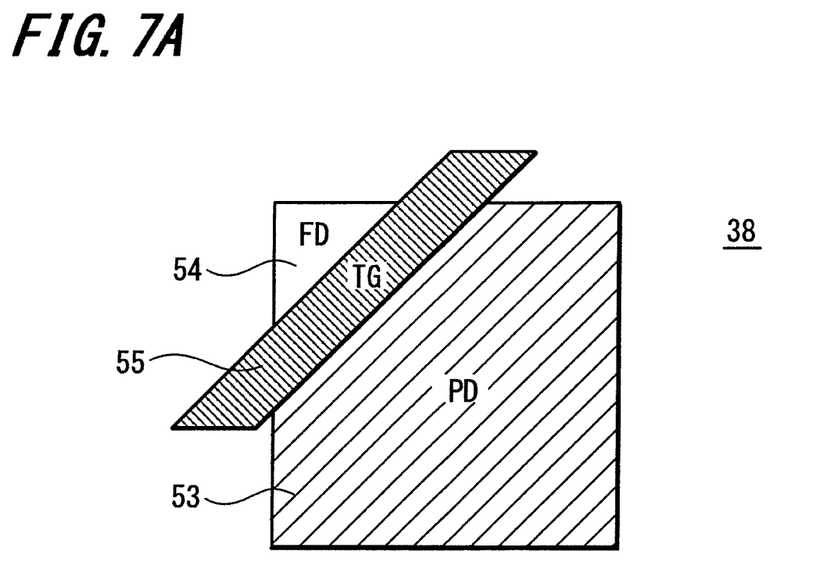
FIG. 7A is a schematic diagram showing a layout of an OB pixel according to the embodiment of the present invention.
Figure 7B:
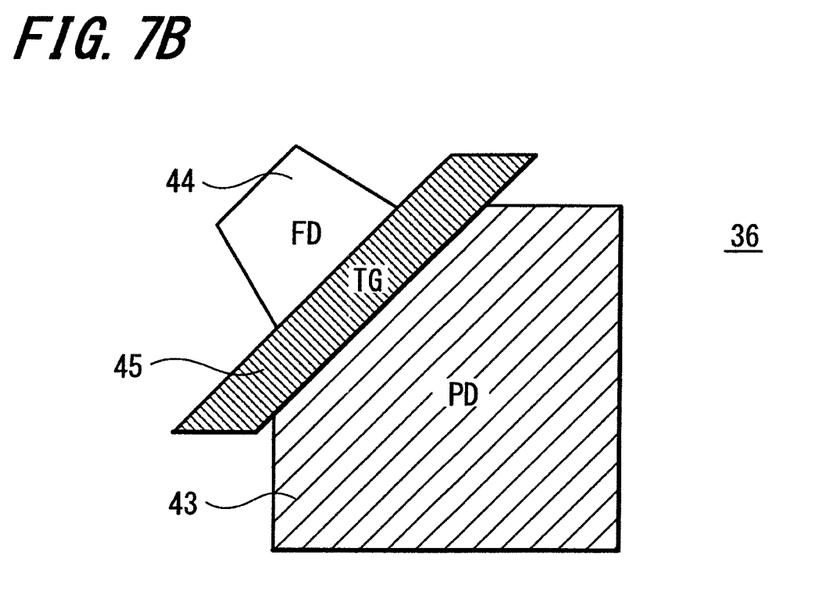
FIG. 7B is a schematic diagram showing a layout of an aperture pixel according to the embodiment of the present invention.

FIGS. 7A and 7B show a second embodiment of the present invention. According to the second embodiment of the present invention, a circumference and a surface area of the floating diffusion portion 44 in the aperture pixel 36 are made different from those of the floating diffusion 54 in the OB pixel 38. FIGS. 7A and 7B show examples of layout thereof. In this embodiment, the circumference and the surface area of the floating diffusion portion 54 in the OB pixel 38 are made smaller than those of the floating diffusion portion 44 in the aperture pixel 36. An amount of dark current increases in proportion to the surface area or the circumferential length of the floating diffusion portions.

Therefore, according to the second embodiment of the present invention, the circumferences and the surface areas of the floating diffusion portions 44 and 54 in the aperture pixel 36 and the OB pixel 38 are appropriately adjusted such that the relationship represented by the equation of F1+P1=F2+P2 is obtained regarding an amount of dark current as shown in the layouts of FIGS. 7A and 7B, thereby adjusting the amount of dark current.

According to the above-mentioned arrangements, the relationship represented by the equation of F1+P1=F2+P2 may be obtained and hence the amount of dark current in the aperture pixel 38 and that in the OB pixel 36 may be equal to each other. As a result, since the reference black level obtained in the OB pixel 36 can be applied to the aperture pixel 38 at any time, an image with improved contrast compared to that of the related art can be output during a one-frame period.

Figure 8:
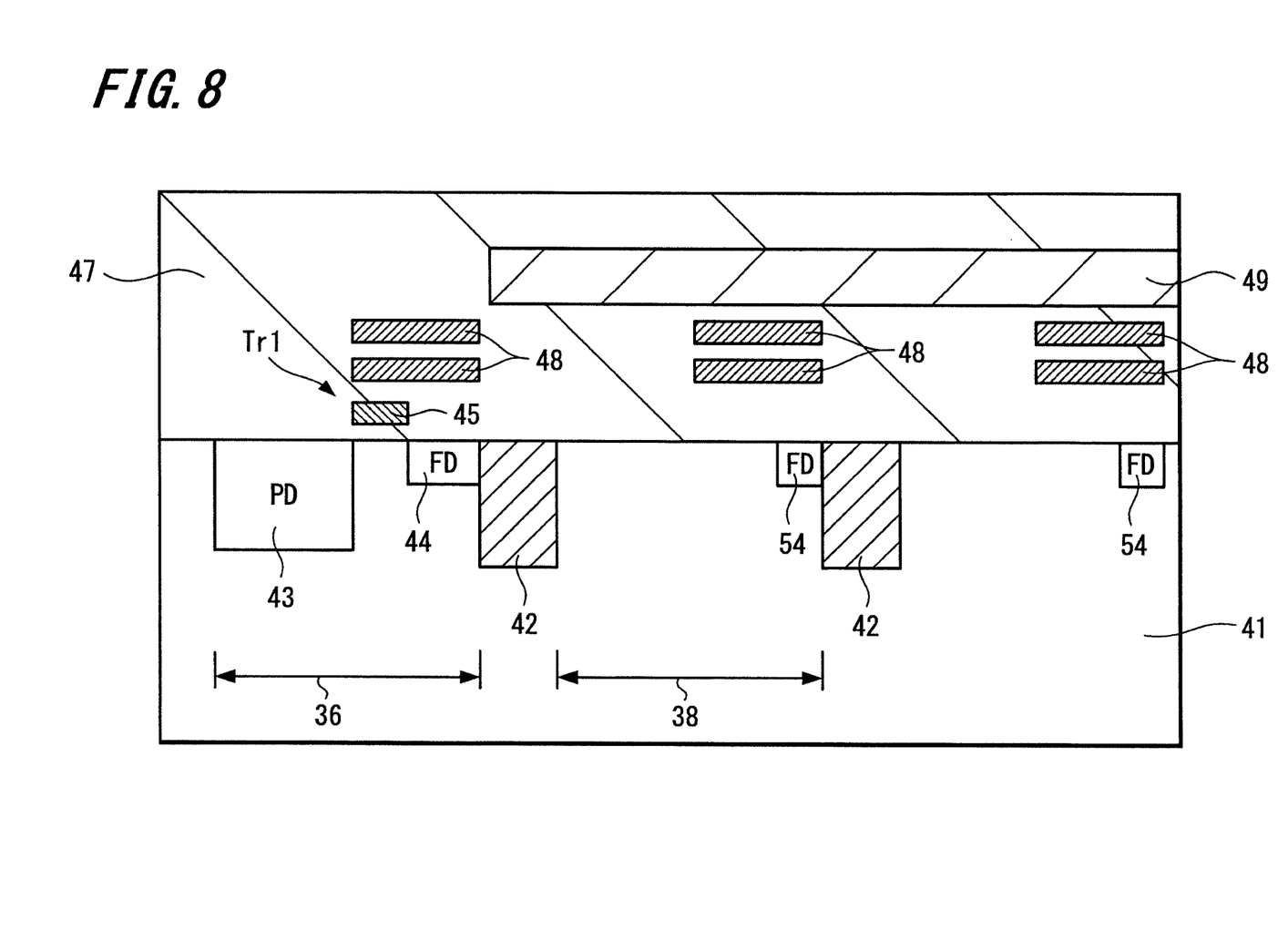
FIG. 8 is a cross-sectional view on the line A-A' in FIG. 5, showing the case in which a PD (photodiode) is not formed in the OB pixel.

FIG. 8 shows a third embodiment of the present invention. Since the amount of dark current can be adjusted by changing the shape of the floating diffusion portion 54, the photodiode 53 can be removed from the OB pixel 38. Specifically, according to the third embodiment, while the aperture pixel 36 includes the photodiode 43 and the floating diffusion portion 44 as described above, the OB pixel 38 may include the floating diffusion portion 54 but not include the photodiode 53. Hence, in order to satisfy an equation of F1=F2+P2, the surface area or the circumference of the floating diffusion portion 54 in the OB pixel 38 is made smaller than that of the floating diffusion portion 44 in the aperture pixel 36.

As described above, according to the third embodiment, the amount of dark current can be adjusted similarly to the first and second embodiments. In addition, since the photodiode 53 is not formed on the OB pixel 38, it may be unnecessary to read a charge from the photodiode 53 in the OB pixel 38.

In this regard, since P1 equals 0, the amount of dark current may be adjusted to obtain the relationship represented by the equation of F1=F2+P2.

Further, since the photodiode 53 is not formed on the OB pixel 38, the area per pixel can be reduced in the OB pixel area 37. Thus, the size of the 08 pixel area 37 can be reduced, thereby reducing a chip area and a cost.

Since the height from the substrate 41 to the light-shielding film 49 is increased in the OB pixel 38, there is a risk that oblique incident light leaks into the photodiode. However, the photodiode 53 is not formed in the OB pixel 38 as described above and there is no area for carrying out photoelectric conversion. Thus, an influence caused by leaking light when the OB pixel 38 is illuminated with a large amount of light can be removed.

Next, a fourth embodiment of the present invention will be described. In the fourth embodiment, both of the aperture pixel 36 and the OB pixel 38 include the photodiode and the floating diffusion portion. Although not shown in the figures, when a charge of the photodiode is transferred to the floating diffusion portion, the charge of the photodiode 53 in the OB pixel 38 may be prevented from being transferred to the floating diffusion portion. The shape of the floating diffusion portion in the OB pixel 38 is adjusted such that the relationship represented by the equation of F1=F2+P2 is obtained regarding the amount of dark current.

According to the fourth embodiment, the following effectiveness can be obtained in addition to that obtained in the first and second embodiments of the present invention. Sensitivity of a pixel strongly depends upon continuity of the shape of the aperture pixel 36 and the shape of the OB pixel 38. Accordingly, if there are variations in the process of manufacturing the aperture pixel 36 and the OB pixel 38, then stable aperture pixels and OB pixels may not be obtained. Therefore, it is desirable to obtain continuity and uniformity regarding the layout of the pixels on the imaging region 32. Accordingly, while both of the aperture pixel 36 and the OB pixel 38 include the photodiode and the floating diffusion portion, a charge may not be read from the photodiode 53 in the OB pixel 38. With such structure, continuity of the layout can be obtained regarding the aperture pixels 36 and the OB pixels 38. In addition, an amount of dark current may be adjusted by slightly changing the layout of the pixels, and leaking light can be prevented when the OB pixel 38 is illuminated with a large amount of light.

Further, in the case of having restrictions on the layout, the amount of dark current may be adjusted so as to satisfy the equation of F1+P1=F2+P2 by changing not only the shape of the floating diffusion portion 54 but also the shape of the photodiode 53 in the OB pixel 38. If degree of freedom is increased regarding the adjustment as described above, an adjusting method conforming to manufacturing conditions and manufacturing processes may be selected.

In addition, according to further another embodiment of the present invention, the shape of the photodiode in the aperture pixel can be made different from that in the OB pixel. For example, the surface area of the photodiode in the OB pixel may be made different from that of the photodiode in the aperture pixel. Specifically, with such structure, the sum of dark current components of the photodiode and the floating diffusion portion in the aperture pixel is made equal to the sum of dark current components of the photodiode and the floating diffusion portion in the OB pixel.

According to the above-described embodiments of the present invention, the shape of a floating diffusion portion is changed such that an amount of dark current of the aperture pixel and that of the OB pixel may be equal to each other. Therefore, if the amount of dark current is changed depending on a temperature and an accumulation time, a stable optical black level may be output from the OB pixel. As a result, contrast of images may be prevented from being deteriorated with dark current. Further, in the case where the photodiode in the OB pixel in the OB pixel area is not formed, the size of the OB pixel may be reduced, the chip area can be reduced and a cost for manufacturing the solid-state imaging device can be reduced. Furthermore, in the case where the photodiode is not formed in the 08 pixel or a charge is not read from the photodiode in the OB pixel area, an unfavorable influence caused by light leaked into the OB pixel area when the OB pixel is illuminated with a large amount of light can be prevented.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   an imaging region including a plurality of pixels arranged in a two-dimensional array, wherein the imaging region includes a plurality of effective pixels and a plurality of black reference pixels;
   at least one of the effective pixels and the black reference pixels having a photoelectric conversion portion and a floating diffusion portion, wherein the floating diffusion portion for the effective pixel is different in size or shape from the floating diffusion portion in the black reference pixel in accordance with an amount of dark currents so that a dark current associated with the black reference pixel and a dark current associated with the effective pixel are substantially equivalent;
   a first isolation region between the floating diffusion portion of the effective pixel and the photoelectric conversion portion of the black reference pixel; and
   a second isolation region between the floating diffusion portion of the black reference pixel and a photoelectric conversion portion of an adjacent black reference pixel.

2. A solid-state imaging device according to claim 1, wherein the floating diffusion portion in the black reference pixel is smaller than the floating diffusion portion in the effective pixel.

3. A solid-state imaging device according to claim 1, wherein a shape of the photoelectric conversion portion in the effective pixel is the same as a shape of the photoelectric conversion portion in the black reference pixel.

4. A solid-state imaging device according to claim 1, wherein a size of the photoelectric conversion portion in the effective pixel is the same as a size of the photoelectric conversion portion of the black reference pixel.

5. A solid-state imaging device according to claim 1, wherein a surface area of the floating diffusion portion in the effective pixel area is different from that in the black reference pixel such that a sum of dark current components of the photoelectric conversion portion and the floating diffusion portion in the effective pixel equals to a sum of dark current components of the photoelectric conversion portion and the floating diffusion portion in the black reference pixel.

6. A solid-state imaging device according to claim 1, wherein a charge in the photoelectric conversion portion is prevented from being transferred to the floating diffusion portion in the black reference pixel.

* * * * *